United States Patent
Fan et al.

(10) Patent No.: US 10,424,626 B2
(45) Date of Patent: Sep. 24, 2019

(54) OLED DISPLAY WITH LIGHT-BLOCKED PIXEL ISOLATION LAYER AND MANUFACTURE METHOD THEREOF

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Yingchun Fan, Guangdong (CN); Jangsoon Im, Guangdong (CN); Xiaoxing Zhang, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/742,586

(22) PCT Filed: Nov. 29, 2017

(86) PCT No.: PCT/CN2017/113564
§ 371 (c)(1),
(2) Date: Jan. 8, 2018

(87) PCT Pub. No.: WO2019/085108
PCT Pub. Date: May 9, 2019

(65) Prior Publication Data
US 2019/0140033 A1    May 9, 2019

(30) Foreign Application Priority Data
Nov. 6, 2017 (CN) .......................... 2017 1 1080856

(51) Int. Cl.
*H01L 27/32* (2006.01)
*H01L 51/52* (2006.01)
(Continued)

(52) U.S. Cl.
CPC ...... *H01L 27/3246* (2013.01); *H01L 27/3258* (2013.01); *H01L 51/5246* (2013.01);
(Continued)

(58) Field of Classification Search
CPC .......................... H01L 51/525; H01L 51/5284
See application file for complete search history.

(56) References Cited

U.S. PATENT DOCUMENTS

2007/0096643 A1* 5/2007 Maglione ............ H01L 27/3246
313/506

FOREIGN PATENT DOCUMENTS

CN    104393024 A    3/2015
CN    105448825 A    3/2016
(Continued)

*Primary Examiner* — Quoc D Hoang
(74) *Attorney, Agent, or Firm* — Hauptman Ham, LLP

(57) ABSTRACT

An OLED display and manufacture method thereof are provided. The OLED display includes a TFT substrate, the TFT substrate having a plurality of light-blocked pixel isolation layers and a plurality of OLED emissive layers on a surface thereof, and each OLED emissive layer having cathode on a surface thereof. The light-blocked pixel isolation layer includes a wall portion, and the wall portion having a light-blocked portion on a surface thereof. The TFT substrate has a plurality of pixel regions surrounded by the wall portions of the light-blocked pixel isolation layers on the surface thereof. Each pixel region respectively has the OLED emissive layer therein. The OLED display and method avoid light leakage caused by the oblique light of each pixel region emitted into adjacent pixel regions while the OLED emissive layer lighting.

5 Claims, 4 Drawing Sheets

(51) Int. Cl.
*H01L 51/56* (2006.01)
*H01L 27/12* (2006.01)
*H01L 51/00* (2006.01)

(52) U.S. Cl.
CPC .......... H01L 51/56 (2013.01); *H01L 27/1248* (2013.01); *H01L 27/322* (2013.01); *H01L 27/3213* (2013.01); *H01L 51/0018* (2013.01); *H01L 2227/323* (2013.01); *H01L 2251/5315* (2013.01)

(56) References Cited

FOREIGN PATENT DOCUMENTS

| | | |
|---|---|---|
| CN | 106129264 A | 11/2016 |
| CN | 107204359 A | 9/2017 |

* cited by examiner

OLED DISPLAY WITH LIGHT-BLOCKED PIXEL ISOLATION LAYER AND MANUFACTURE METHOD THEREOF

RELATED APPLICATIONS

The present application is a National Phase of International Application Number PCT/CN2017/113564, filed on Nov. 29, 2017, and claims the priority of China Application 201711080856.4, filed on Nov. 6, 2017.

FIELD OF THE DISCLOSURE

The disclosure relates to a display technical field, and more particularly to an OLED display and manufacture method thereof.

BACKGROUND

The Organic Light Emitting Display (OLED) possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The OLED can be categorized into two major types according to the driving ways, which are the Passive Matrix OLED (PMOLED) and the Active Matrix OLED (AMOLED), i.e. two types of the direct addressing and the Thin Film Transistor (TFT) matrix addressing. The AMOLED comprises pixels arranged in array and belongs to active display type, which has high lighting efficiency and is generally utilized for the large scale display devices of high resolution.

A OLED display element usually comprises: a substrate, an anode formed on the substrate, a hole injection layer formed on the anode, a hole transport layer formed on the hole injection layer, an emissive layer formed on the hole transport layer, an electron injection layer formed on the emitting layer, an electron transport layer formed on the electron injection layer, a cathode formed on the electron injection layer. The illuminating principle of OLED is the phenomenon that is the illumination due to the carrier injection and recombination under the electric field driving of organic semiconductor illuminating material and illuminating material. Specifically, the OLED display element generally utilizes the ITO transparent electrode and the metal electrode respectively as the anode and the cathode of the display. Under certain voltage driving, the electron and the hole are respectively injected into the electron and hole injection layers from the cathode and the anode. The electron and the hole respectively migrate from the electron and hole transport layers to the emissive layer and bump into each other in the emissive layer to form an exciton to excite the emitting molecule. The latter can illuminate after the radiative relaxation.

Reference is made to FIG. 1, which is a structural schematic view of a conventional top-emitting-light display. The OLED display includes a TFT substrate 100', the TFT substrate 100' having a plurality of pixel isolation layers 200' on a surface thereof, the TFT substrate 100' having a plurality of OLED emissive layers 300' on the surface thereof, each OLED emissive layer 300' having a cathode 400' on a surface thereof, a cover plate 500' covered on the pixel isolation layer 200' and the cathodes 400', and a sealant 600' bonding the cover plate 500' and the TFT substrate 100'.

The TFT substrate 100' includes: a base substrate 110', the base substrate 110' having a TFT array layer 120' on a surface thereof, the TFT array layer 120' having a planarization layer 130' cover a surface thereof, and the planarization layer 130' having a plurality of anodes 140'. The TFT substrate 100' has a plurality of pixel regions 101' surrounded by the pixel isolation layers 200' on the surface thereof. Each pixel region 101' respectively has the OLED emissive layer 300' therein. The cover plate 500' has a light-filter layer 510'. The OLED emissive layers 300' are generated by printing or evaporating the OLED illuminating material within the pixel regions 101'. Whether it is the manner of printing or evaporating, the oblique light of each pixel region emitted into adjacent pixel regions occurs the light leakage while the OLED emissive layer 300' lighting, so as to decrease the quality of display.

SUMMARY

A technical problem to be solved by the disclosure is to provide an OLED display for preventing light leakage while the OLED emissive layer lighting, so as to increase display quality.

Furthermore, the disclosure further provides a manufacture method of the OLED display for preventing light leakage while the OLED emissive layer lighting and increasing the OLED display quality.

An objective of the disclosure is achieved by following embodiments. The disclosure provides an OLED display, includes: a TFT substrate, the TFT substrate having a plurality of light-blocked pixel isolation layers and a plurality of OLED emissive layers on a surface thereof, and each OLED emissive layer having a cathode on a surface thereof;

Wherein the light-blocked pixel isolation layer includes a wall portion, and the wall portion having a light-blocked portion on a surface thereof; the TFT substrate has a plurality of pixel regions surrounded by the wall portions of the light-blocked pixel isolation layers on the surface thereof, each pixel region respectively has the OLED emissive layer therein.

In an embodiment, the TFT substrate includes: a base substrate, the base substrate having a TFT array layer on a surface thereof, the TFT array layer having a planarization layer cover a surface thereof, and the planarization layer having a plurality of anodes corresponding the pixel regions.

In an embodiment, the OLED display further includes a cover plate covered on the light-blocked pixel isolation layer and the cathodes, and a sealant bonding the cover plate and the TFT substrate, wherein the OLED display is a top-light-emitting OLED display.

In an embodiment, the light-blocked pixel isolation layer is composed of organic material or inorganic material.

The disclosure further provides a method for manufacturing the OLED display, includes following steps:

STEP S1, providing a TFT substrate;

STEP S2, generating the TFT substrate having a plurality of light-blocked pixel isolation layers on a surface thereof; wherein the light-blocked pixel isolation layer includes a wall portion, and the wall portion having a light-blocked portion on a surface thereof; the TFT substrate has a plurality of pixel regions surrounded by the wall portions of the light-blocked pixel isolation layers on the surface thereof; and STEP S3, generating each pixel region respectively having an OLED emissive layer therein.

In an embodiment, the TFT substrate includes: a base substrate, the base substrate having a TFT array layer on a surface thereof, the TFT array layer having a planarization layer cover a surface thereof, and the planarization layer having a plurality of anodes corresponding to the pixel regions.

In an embodiment, the method for manufacturing the OLED display further includes following steps:

STEP S4, generating the OLED emissive layer having the cathode on a surface thereof;

STEP S5, providing a cover plate having a sealant on one side thereof to bond with the TFT substrate having the light-blocked pixel layer on one side thereof, so as to generate the OLED display, wherein the OLED display is a top-light-emitting OLED display.

In an embodiment, the light-blocked pixel isolation layer is composed of organic material or inorganic material.

In an embodiment, if the light-blocked pixel isolation layer is composed of light sensitive material, the STEP S2 of generating the TFT substrate having a plurality of light-blocked pixel isolation layers further includes:

coating a first pixel isolation layer on the surface of the TFT substrate, and exposing and developing the first pixel isolation layer by a halftone mask to form the light-blocked pixel isolation layer; or if the light-blocked pixel isolation layer is composed of light non-sensitive material, the STEP S2 of generating the TFT substrate having a plurality of light-blocked pixel isolation layers further includes:

generating the TFT substrate having a second pixel isolation layer on a surface thereof, and after then generating the second pixel isolation layer having light-blocked portion on a surface thereof;

exposing and developing the light-blocked portion by the halftone mask to form a light-blocked pattern corresponding to the light-blocked pixel isolation layer, wherein the thickness related with a first portion of the light-blocked pattern corresponding to the light-blocked portion is greater than the thickness related with a second portion being exclusive of the first portion of the light-blocked pattern corresponding to the light-blocked portion, the second pixel isolation layer is etched by utilizing the light-blocked pattern to be a block to remove unblock portion of the second pixel isolation layer, after then the light-blocked pattern is performed by an ashing process to remove the second portion being exclusive of the first portion of the light-blocked pattern corresponding to the light-blocked portion, and the second pixel isolation layer is etched by utilizing the light-blocked pattern performed by the ashing process to form the light-blocked pixel isolation layers.

In an embodiment, in STEP S3, each pixel region respectively having an OLED emissive layer therein is generated by manners of printing or evaporating.

The disclosure further provides an OLED display, includes: a TFT substrate, the TFT substrate having a plurality of light-blocked pixel isolation layers and a plurality of OLED emissive layers on a surface thereof, and each OLED emissive layer having cathode on a surface thereof;

wherein the light-blocked pixel isolation layer includes a wall portion, and the wall portion having a light-blocked portion on a surface thereof, the TFT substrate having a plurality of pixel regions surrounded by the wall portions of the light-blocked pixel isolation layers on the surface thereof, and each pixel region respectively having the OLED emissive layer therein;

wherein the TFT substrate includes: a base substrate, the base substrate having a TFT array layer on a surface thereof, the TFT array layer having a planarization layer cover a surface thereof, and the planarization layer having a plurality of anodes corresponding the pixel regions;

further includes a cover plate covered on the light-blocked pixel isolation layer and the cathodes, and a sealant bonding the cover plate and the TFT substrate, wherein the OLED display is a top-light-emitting OLED display; and wherein the light-blocked pixel isolation layer is composed of organic material or inorganic material.

The disclosure provides an OLED display. The OLED display includes a TFT substrate having a plurality of light-blocked pixel isolation layers. The light-blocked pixel isolation layer includes a wall portion, and the wall portion having a light-blocked portion on a surface thereof. The TFT substrate has a plurality of pixel regions surrounded by the wall portions of the light-blocked pixel isolation layers on the surface thereof. By the light-blocked pixel isolation layer having the light-blocked portion, can avoid light leakage caused by the oblique light of each pixel region emitted into adjacent pixel regions while the OLED emissive layer lighting, so as to increase the quality for the OLED display. The manufacture method of the OLED display provided by the disclosure can prevent light leakage while the OLED emissive layer lighting and increasing the OLED display quality.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The disclosure will be further described in detail with reference to accompanying drawings and preferred embodiments as follows.

In the following, structures of display panels associated with the disclosure will be described with reference to FIG. 1 through FIG. 7.

Figure 1:
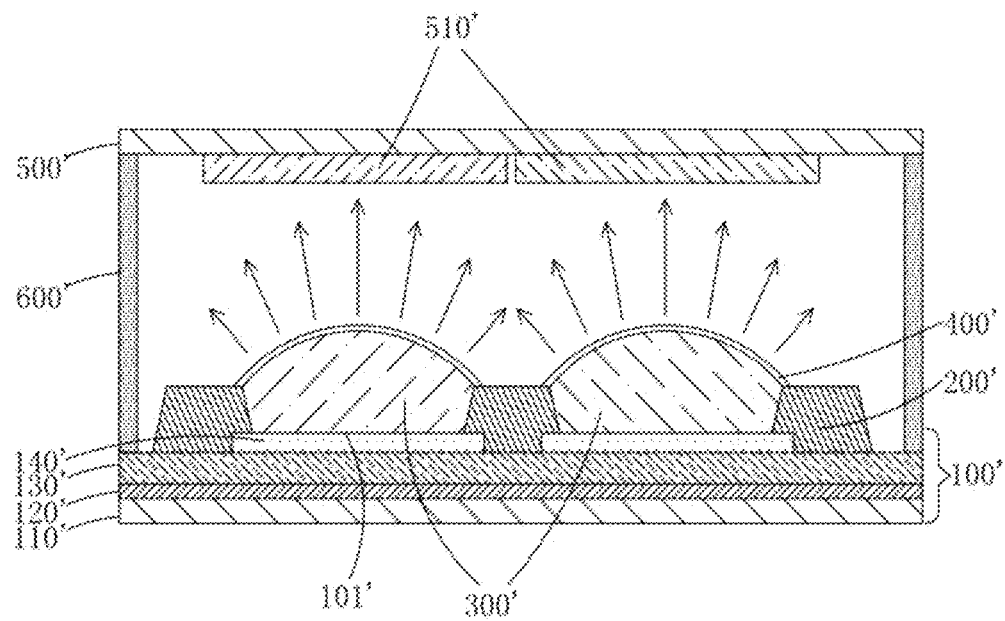
FIG. 1 is a structural schematic view of a conventional top-emitting-light display.
Figure 2:
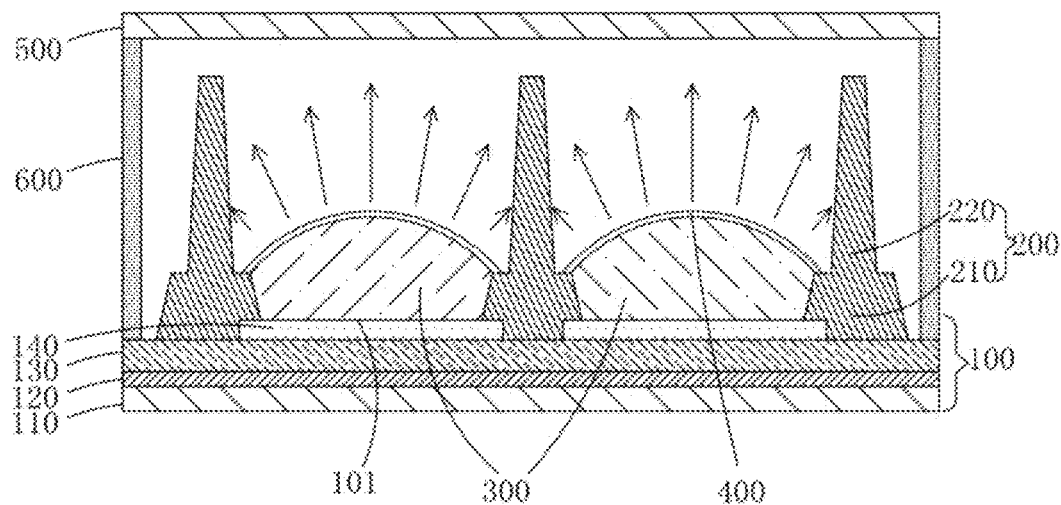
FIG. 2 is a structural schematic view of an OLED display according to an embodiment of the disclosure.

Reference is made to FIG. 2, the disclosure provides an OLED display. The OLED display includes a TFT substrate 100, the TFT substrate 100 having a plurality of pixel isolation layers 200 on a surface thereof, the TFT substrate 100 having a plurality of OLED emissive layers 300 on the surface thereof, each OLED emissive layer 300 having a cathode 400 on a surface thereof, a cover plate 500 covered on the pixel isolation layer 200 and the cathodes 400, and a sealant 600 bonding the cover plate 500 and the TFT substrate 100.

It is worth to note, the light-blocked pixel isolation layer 200 includes a wall portion 210, and the wall portion 210 having a light-blocked portion 220 on a surface thereof. The TFT substrate 100 has a plurality of pixel regions 101 surrounded by the wall portions 210 of the light-blocked pixel isolation layers 200 on the surface thereof.

Specifically, the TFT substrate 100 includes: a base substrate 110, the base substrate 110 having a TFT array layer 120 on a surface thereof, the TFT array layer 120 having a planarization layer 130 cover a surface thereof, and the planarization layer 130 having a plurality of anodes 140 corresponding the pixel regions 101.

Specifically, the base substrate 110 can be realized by, for example, a glass substrate.

Specifically, the TFT array layer 120 has a plurality of TFTs, the TFTs can be realized by, for example, LTPS TFT, Oxide TFT, SPC TFT, or other TFT types usually used on OLED display.

Specifically, the planarization layer 130 can be an inorganic layer made by Chemical Vapor Deposition (CVD), an organic layer formed by Coating, or combination thereof. Material of the organic layer can be optionally realized by Polyimide (PI).

Specifically, the OLED display is a top-light-emitting OLED display.

Specifically, the OLED display includes red OLED emissive layer, green OLED emissive layer, blue OLED emissive layer, and/or white OLED emissive layer.

Furthermore, the cover plate 500 has a light-filter layer (not illustrated) on a side adjacent to the TFT substrate 100 thereof. The light-filter layer filters the light emitted from the OLED emissive layer 300.

Specifically, the material of the cover plate 500 can be realized by, for example, a glass.

Specifically, the light-blocked pixel isolation layer 200 is composed of organic material or inorganic material, it is not limited hereto.

Specifically, the light-blocked pixel isolation layer 200 can be optionally realized by light sensitive material such as photosensitive polyimide photoresist (PSPI), or realized by light non-sensitive material. Correspondingly, if the light-blocked pixel isolation layer 200 is composed of the light sensitive material, a first pixel isolation layer on the surface of the TFT substrate 100 is exposed and developed by a halftone mask to form the light-blocked pixel isolation layers 200. If the light-blocked pixel isolation layer 200 is composed of the light non-sensitive material, a second pixel isolation layer and light-blocked portion are sequentially formed on a surface of the TFT substrate 100. And then, the light-blocked portion is exposed and developed by the halftone mask. The light-blocked portion is utilized to be a block to etch the second pixel isolation layer, so as to form the light-blocked pixel isolation layers 200.

For more detail, reference is made to FIG. 2, the OLED display of this disclosure, by the light-blocked pixel isolation layer 200 having the light-blocked portion 220, can avoid light leakage caused by the oblique light of each pixel region 101 emitted into adjacent pixel regions 101 while the OLED emissive layer 300 lighting, so as to increase the quality for the OLED display.

Figure 3:
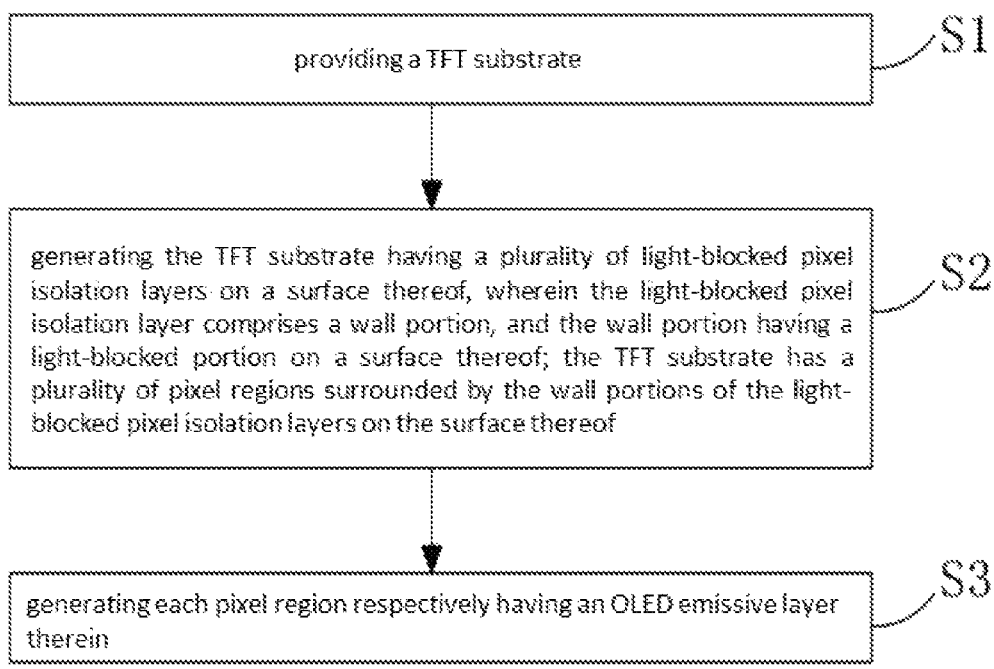
FIG. 3 is a flowchart of a manufacture method of the OLED display according to the embodiment of the disclosure.
Figure 4:
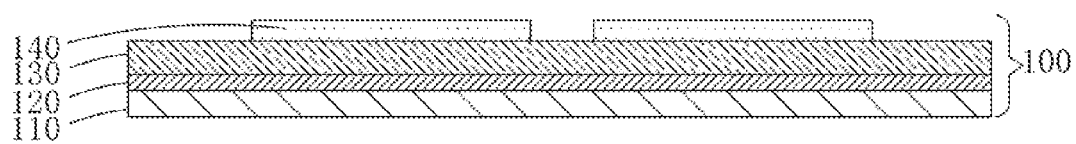
FIG. 4 is a structural schematic view of STEP S1 of the manufacture method of the OLED display according to the embodiment of the disclosure.

Reference is made to FIG. 3, based on the same inventive concept, the disclosure provides a manufacture method for the OLED display, which includes following steps:

STEP S1, reference is made to FIG. 4, the TFT substrate 100 is provided.

Specifically, the TFT substrate 100 includes: a base substrate 110, the base substrate 110 having a TFT array layer 120 on a surface thereof, the TFT array layer 120 having a planarization layer 130 cover a surface thereof, and the planarization layer 130 having a plurality of anodes 140 corresponding to the pixel regions 101.

Specifically, the base substrate 110 can be realized by, for example, a glass substrate.

Specifically, the TFT array layer 120 has a plurality of TFTs, the TFTs can be realized by, for example, LTPS TFT, Oxide TFT, SPC TFT, or other TFT types usually used on the OLED display.

Specifically, the planarization layer 130 can be an inorganic layer made by Chemical Vapor Deposition (CVD), an organic layer formed by Coating, or combination thereof. Material of the organic layer can be optionally realized by Polyimide (PI).

Figure 5:
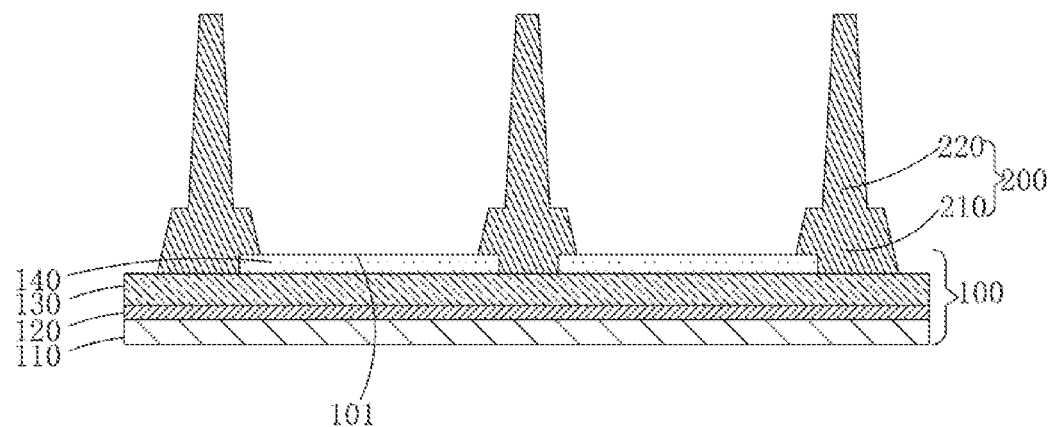
FIG. 5 is a structural schematic view of STEP S2 of the manufacture method of the OLED display according to the embodiment of the disclosure.

STEP S2, reference is made to FIG. 5, a plurality of light-blocked pixel isolation layers 200 are generated on a surface of the TFT substrate 100.

The light-blocked pixel isolation layer 200 includes a wall portion 210, and the wall portion 210 having a light-blocked portion 220 on a surface thereof. The TFT substrate 100 has a plurality of pixel regions 101 surrounded by the wall portions 210 of the light-blocked pixel isolation layers 200 on the surface thereof.

Optionally, the light-blocked pixel isolation layer 200 is composed of organic material or inorganic material.

Optionally, the light-blocked pixel isolation layer 200 can be realized by light sensitive material such as photosensitive polyimide photoresist (PSPI); correspondingly, if the light-blocked pixel isolation layer 200 is composed of the light sensitive material, a first pixel isolation layer on the surface of the TFT substrate 100 is exposed and developed by a halftone mask to form the light-blocked pixel isolation layers 200.

Optionally, the light-blocked pixel isolation layer 200 can be realized by light non-sensitive material. Correspondingly, if the light-blocked pixel isolation layer 200 is composed of the light non-sensitive material, a second pixel isolation layer is generated by Chemical Vapor Deposition (CVD) or other manners usually used to form the light non-sensitive material on the OLED display, and then the light-blocked portion 220 is generated on a surface of the second pixel isolation layer. The light-blocked portion 220 is exposed and developed by the halftone mask to form a light-blocked pattern corresponding to the light-blocked pixel isolation layer 200. The thickness related with a first portion of the light-blocked pattern corresponding to the light-blocked portion 220 is greater than the thickness related with a second portion being exclusive of the first portion of the light-blocked pattern corresponding to the light-blocked portion 220. The light-blocked pattern is utilized to be a block to etch the second pixel isolation layer, so as to form the light-blocked pixel isolation layers 200.

Figure 6:
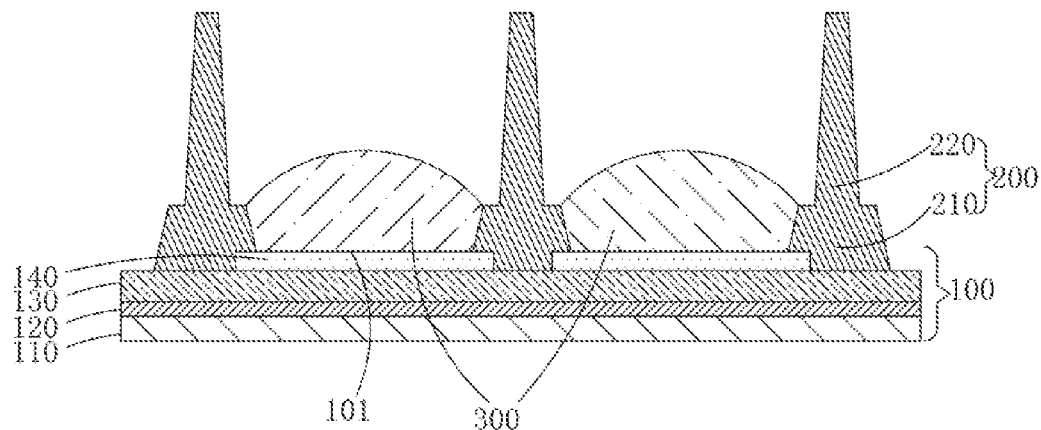
FIG. 6 is a structural schematic view of STEP S3 of the manufacture method of the OLED display according to the embodiment of the disclosure.

STEP S3, reference is made to FIG. 6, an OLED emissive layer 300 is respectively generated in each pixel region 101.

Specifically, each pixel region 101 respectively having the OLED emissive layer 300 therein is generated by manners of printing or evaporating.

Specifically, the OLED emissive layer 300 includes a red OLED emissive layer, a green OLED emissive layer, a blue OLED emissive layer, and/or a white OLED emissive layer.

Figure 7:
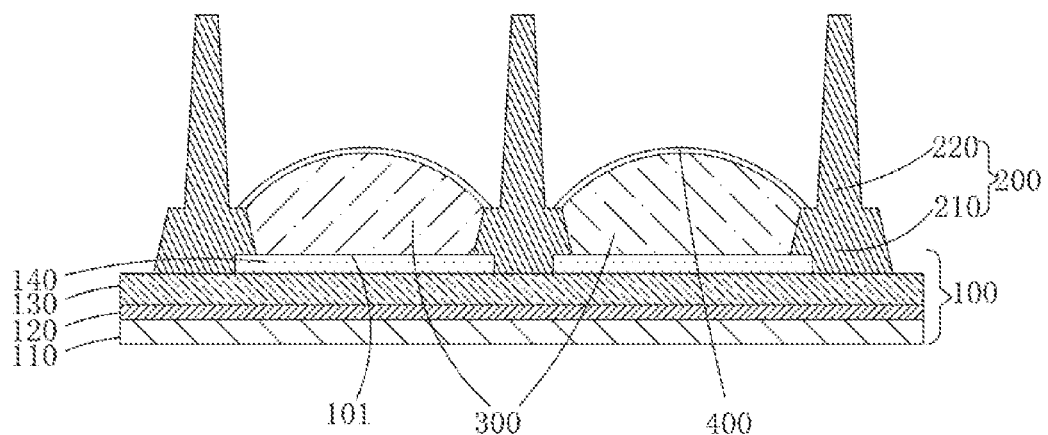
FIG. 7 is a structural schematic view of STEP S4 of the manufacture method of the OLED display according to the embodiment of the disclosure.

STEP S4, reference is made to FIG. 7, the cathode is generated on a surface of the OLED emissive layer 300.

Specifically, the material of the cathode can be realized by, for example, silver-magnesium alloys.

STEP S5, a cover plate 500 is provided. The cover plate 500 has a sealant 600 on one side thereof to bond with the TFT substrate 100 having the light-blocked pixel layer 200 on one side thereof, so as to generate the OLED display. The OLED display is a top-light-emitting OLED display.

Furthermore, one side of the cover plate 500 having the sealant 600 can depose a light-filter layer (not illustrated), the light-filter layer filters the light emitted from the OLED emissive layer 300.

Specifically, the base substrate 110 can be realized by, for example, glass substrate.

For more detail, the OLED display of this disclosure, by making the light-blocked pixel isolation layer 200 having the light-blocked portion 220, can avoid light leakage caused by the oblique light of each pixel region 101 emitted into adjacent pixel regions 101 while the OLED emissive layer 300 lighting, so as to increase the quality for the OLED display.

In summary, the TFT substrate of the OLED display provided by this disclosure includes a TFT substrate having a plurality of light-blocked pixel isolation layers. The light-blocked pixel isolation layer includes a wall portion, and the wall portion having a light-blocked portion on a surface thereof. The TFT substrate has a plurality of pixel regions surrounded by the wall portions of the light-blocked pixel isolation layers on the surface thereof. Each pixel region respectively has the OLED emissive layer therein. The provided OLED display avoids light leakage caused by the oblique light of each pixel region emitted into adjacent pixel regions while the OLED emissive layer lighting, so as to increase display quality. The manufacture method of the OLED display of this disclosure can prevent light leakage while the OLED emissive layer lighting and increases the OLED display quality.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A method for manufacturing an OLED display, comprising:
    STEP S1, providing a TFT substrate;
    STEP S2, generating the TFT substrate having a plurality of light-blocked pixel isolation layers on a surface thereof;
    wherein the light-blocked pixel isolation layer comprises a wall portion, and the wall portion having a light-blocked portion on a surface thereof; the TFT substrate has a plurality of pixel regions surrounded by the wall portions of the light-blocked pixel isolation layers on the surface thereof; and
    STEP S3, generating each pixel region respectively having an OLED emissive layer therein;
    wherein if the light-blocked pixel isolation layer is composed of light non-sensitive material, the STEP S2 of generating the TFT substrate having a plurality of light-blocked pixel isolation layers further comprises:
    generating the TFT substrate having a second pixel isolation layer on a surface thereof, and after then generating the second pixel isolation layer having light-blocked portion on a surface thereof;
    exposing and developing the light-blocked portion by a halftone mask to form a light-blocked pattern corresponding to the light-blocked pixel isolation layer, wherein the thickness related with a first portion of the light-blocked pattern corresponding to the light-blocked portion is greater than the thickness related with a second portion being exclusive of the first portion of the light-blocked pattern corresponding to the light-blocked portion, the second pixel isolation layer is etched by utilizing the light-blocked pattern to be a block to remove unblock portion of the second pixel isolation layer, after then the light-blocked pattern is performed by an ashing process to remove the second portion being exclusive of the first portion of the light-blocked pattern corresponding to the light-blocked portion, and the second pixel isolation layer is etched by utilizing the light-blocked pattern performed by the aching process to form the light-blocked pixel isolation layers.

2. The method according to claim 1, wherein the TFT substrate comprises: a base substrate, the base substrate having a TFT array layer on a surface thereof, the TFT array layer having a planarization layer cover a surface thereof, and the planarization layer having a plurality of anodes corresponding to the pixel regions.

3. The method according to claim 1, further comprising:
    STEP S4, generating the OLED emissive layer having a cathode on a surface thereof;
    STEP S5, providing a cover plate having a sealant on one side thereof to bond with the TFT substrate having the light-blocked pixel layer on one side thereof, so as to generate the OLED display, wherein the OLED display is a top-light-emitting OLED display.

4. The method according to claim 1, wherein the light-blocked pixel isolation layer is composed of organic material or inorganic material.

5. The method according to claim 1, wherein STEP S3 of generating each pixel region respectively having an OLED emissive layer therein further comprises:
    generating the OLED emissive layer by manners of printing or evaporating.

* * * * *